United States Patent
Bilak et al.

(10) Patent No.: US 7,091,765 B2
(45) Date of Patent: Aug. 15, 2006

(54) CIRCUIT POWER REDUCTION USING MICRO-ELECTROMECHANICAL SWITCHES

(75) Inventors: Mark R. Bilak, Sandy Hook, CT (US); Thomas J. Fleischman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 10/711,693

(22) Filed: Sep. 30, 2004

(65) Prior Publication Data

US 2006/0066370 A1    Mar. 30, 2006

(51) Int. Cl.
*G05F 1/10* (2006.01)
(52) U.S. Cl. ....................... 327/199; 327/544
(58) Field of Classification Search .............. 327/199, 327/202, 203, 208, 210, 215, 218, 219, 544
See application file for complete search history.

(56) References Cited

U.S. PATENT DOCUMENTS

| | | | |
|---|---|---|---|
| 6,580,947 B1 * | 6/2003 | Thompson | ............... 607/30 |
| 6,621,392 B1 | 9/2003 | Volant et al. | |
| 6,635,506 B1 | 10/2003 | Volant et al. | |
| 2003/0178635 A1 | 9/2003 | Volant et al. | |
| 2004/0134281 A1 * | 7/2004 | Pedrazzini et al. | ........... 73/652 |

* cited by examiner

*Primary Examiner*—Jeffrey Zweizig
(74) *Attorney, Agent, or Firm*—Lisa U. Jaklitsch; Hoffman, Warnick & D Alessandro LLC

(57) ABSTRACT

The invention provides micro-electromechanical switch (MEM) based designs for reducing the power consumption of logic blocks (e.g., latches) by isolating the logic blocks when they are non-operational. A power reduction circuit in accordance with the present invention comprises a logic block and at least one micro-electromechanical (MEM) switch for selectively disabling the logic block. MEM switches are provided for selectively: disconnecting the logic block from power; disconnecting the logic block from ground; providing a bypass line around the logic block; disconnecting an output of the logic block; and/or disconnecting an input of the logic block.

18 Claims, 4 Drawing Sheets

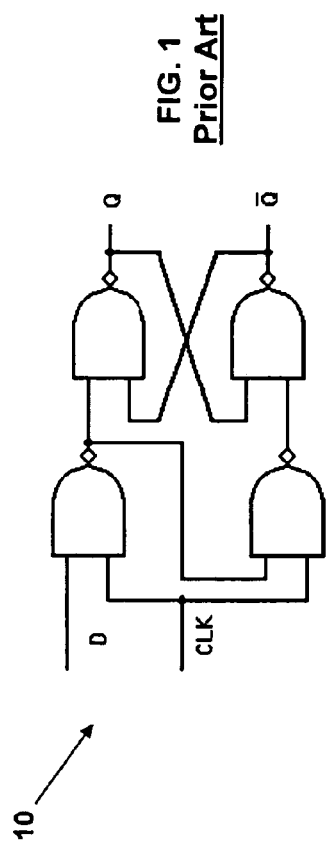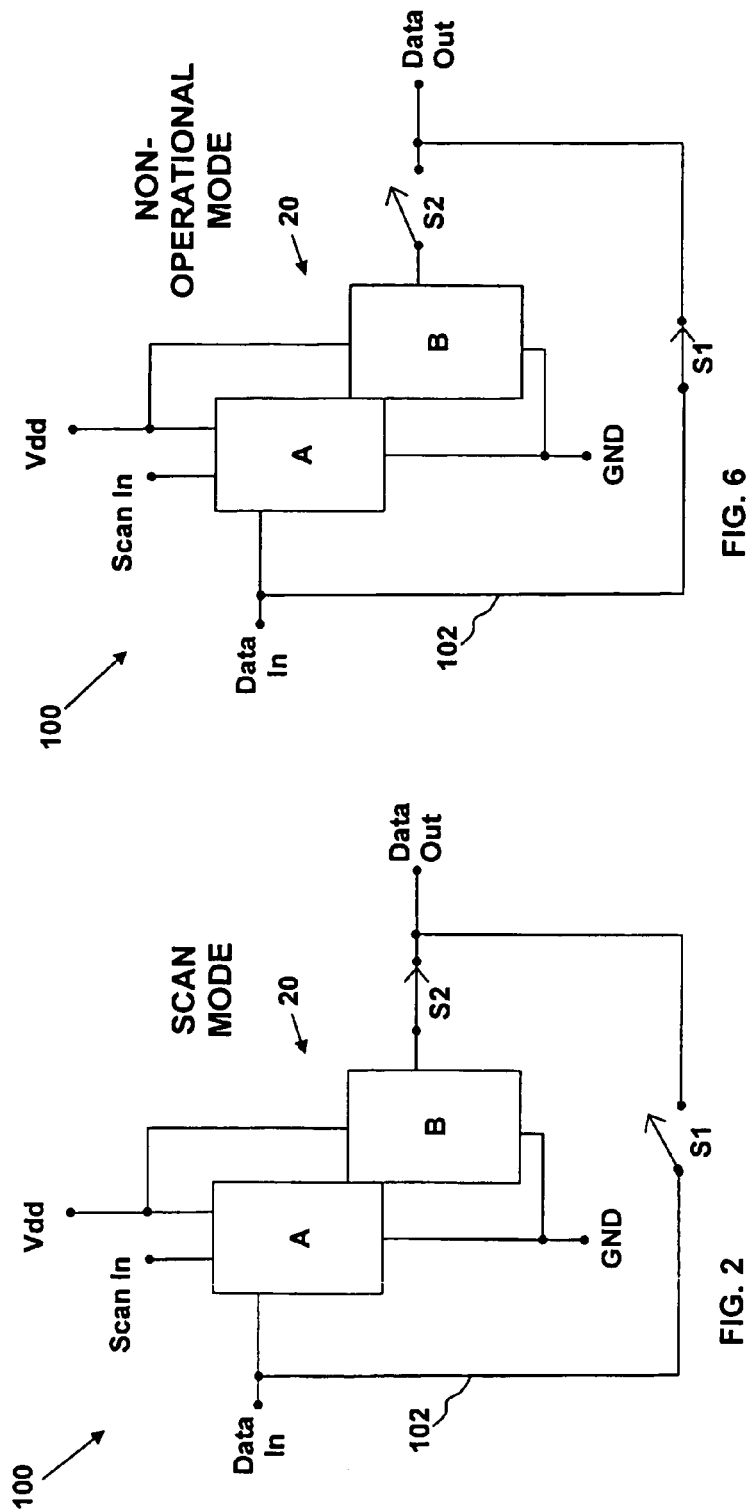

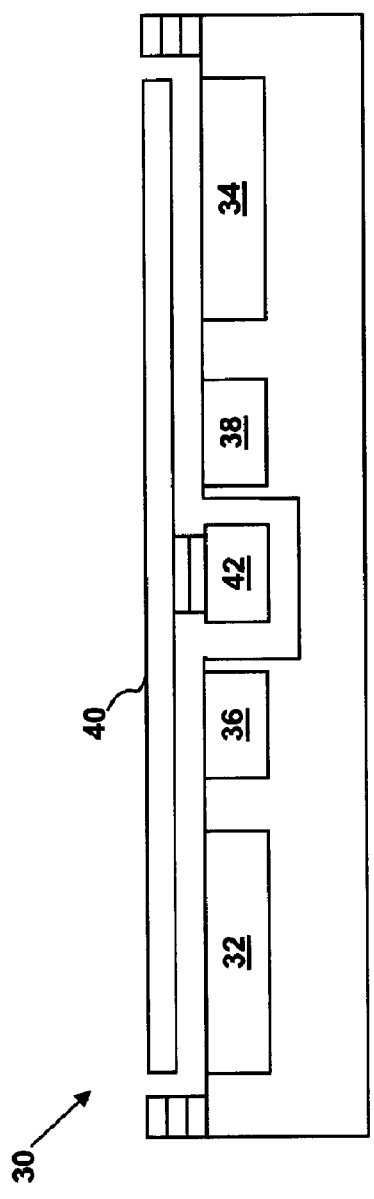
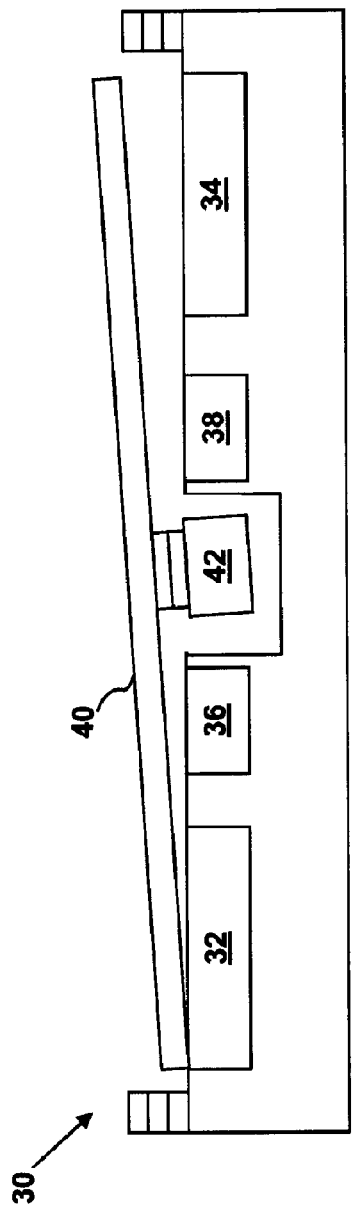
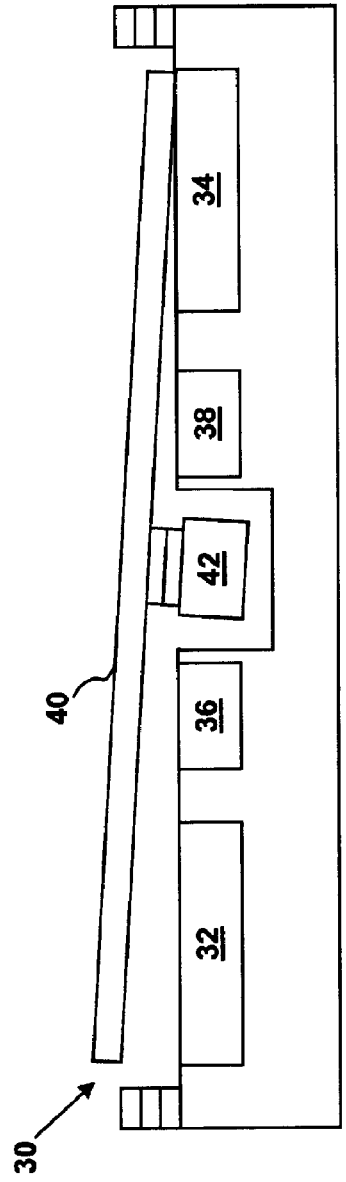
FIG. 3
FIG. 4
FIG. 5

CIRCUIT POWER REDUCTION USING MICRO-ELECTROMECHANICAL SWITCHES

BACKGROUND OF INVENTION

1. Technical Field

The present invention relates generally to integrated circuits and, in particular, to circuit power reduction using micro-electromechanical (MEM) switches.

2. Related Art

As integrated circuit ground rules and manufacturing techniques allow for smaller and smaller device sizes, the power consumption of these circuits climbs rapidly. As a result of shorter transistor channel lengths, thinner gate oxide, and increased numbers of transistors, leakage current is quickly becoming a dominant power consumer in today's integrated circuit designs.

An example of increased power consumption is associated with the use of latches in integrated circuits to improve testability, test coverage, observability, and overall logical data flow control. These types of latches, which are not always used in the functional operation of an integrated circuit, add loading to the functional circuitry of the integrated circuit and also consume power due to high leakage currents and/or power dissipation during operation.

Traditional storage latches, such as a Data latch ("D-latch"), are implemented using various circuit layouts. One such D-latch layout 10 is illustrated in FIG. 1. When the clock input ("CLK") to the D-latch 10 is logic 1, the Q output will always reflect the logic level present at the D-latch input D. When the CLK input falls to logic 0, the last state of the D-latch input D is trapped, or latched, for use by whatever other circuits may be using this signal. Many other types of storage latch designs are well known in the art.

Traditional storage latch designs may be implemented in any common semiconductor chip fabrication process such as Complementary Metal Oxide Semiconductor (CMOS), bipolar, bipolar CMOS (BiCMOS), silicon germanium (SiGe), etc. Today's design techniques implement these latch designs using standard transistor-based methods that insure compatibility with today's design techniques. Unfortunately, current latch designs have significant drawbacks: power dissipation when active and leakage currents are not in use, thus driving integrated circuit power requirements higher. Each latch used in an integrated circuit adds to the total dynamic and static power consumption of the integrated circuit. This power consumption becomes non-trivial as transistor sizes continue to decrease, device speeds increase and the number of latches used by integrated circuits increases.

Accordingly, there is a need for a circuit design that isolates logic blocks (e.g., latches) when they are non-operational, thus reducing power consumption and improving performance, while minimally impacting overall size of the design.

SUMMARY OF INVENTION

The present invention provides micro-electromechanical switch (MEM) based designs for reducing the power consumption of logic blocks (e.g., latches) by isolating the logic blocks when they are non-operational.

A first aspect of the invention is directed to a power reduction circuit, comprising: a logic block; and at least one micro-electromechanical (MEM) switch for selectively disabling the logic block.

A second aspect of the invention is directed to a method for power reduction, comprising: providing a logic block; and selectively disabling the logic block using at least one micro-electromechanical (MEM) switch.

A third aspect of the invention is directed to a circuit, comprising: a logic block; a micro-electromechanical (MEM) switch for selectively disconnecting the logic block from power; a MEM switch for selectively disconnecting the logic block from ground; a bypass line connected between an input and output of the logic block for passing data around the logic block; and a MEM switch for selectively disconnecting the bypass line.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 1 depicts a conventional D-latch circuit.

FIG. 2 depicts an embodiment of the present invention, wherein a plurality of MEM switches are incorporated into a latch circuit, and wherein the latch circuit is in a scan mode.

FIGS. 3–5 depict an illustrative double-pole MEM switch.

FIG. 6 depicts the embodiment of the present invention illustrated in FIG. 2, wherein the latch circuit is in a non-operational mode.

DETAILED DESCRIPTION

Figure 8:
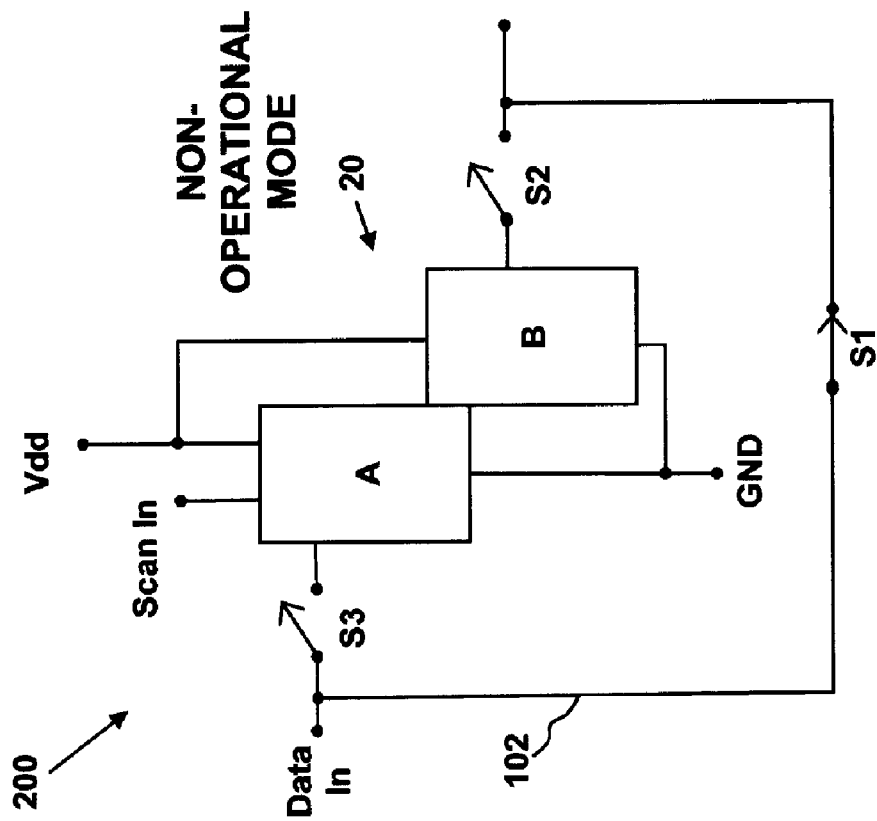
FIG. 8 depicts the embodiment of the present invention illustrated in FIG. 7, wherein the latch circuit is in a non-operational mode.

The present invention provides micro-electromechanical (MEM) switch-based designs for reducing the power consumption of logic blocks (e.g., latches) by isolating the logic blocks when they are non-operational. Although the present invention will be described in detail below in combination with a data latch, it should be noted that the present invention can be used to reduce the power consumption of a wide variety of other types of logic blocks and circuits, including, for example, memory arrays, embedded memory arrays, control logic, registers, application specific integrated circuit (ASIC) cores, microprocessors, multithreaded processors, etc.

An embodiment 100 of the present invention is illustrated in FIG. 2. As shown, a pair of MEM switches S1 and S2 are incorporated into a latch circuit 20, which is operating in a scan mode. In this example, the latch circuit 20 comprises a scan-type (e.g., a level-sensitive scan design (LSSD)) double-latch circuit of a type known in the art. The latch circuit 20 is constructed using the design techniques for the semiconductor process involved. The MEM switches S1 and S2 require no additional silicon area because they are built into the metal wiring layers of the integrated circuit. In this embodiment of the present invention, MEM switch S1 is placed in a bypass connection 102 between the Data In and Data Out lines of the latch circuit 20, while MEM switch S2 is placed in the Data Out line of the latch circuit 20.

Before presenting the embodiment 100 of the present invention illustrated in FIG. 2 in greater detail, a brief discussion of MEM switches will be provided with reference to FIG. 3, in which an illustrative MEM switch 30 is shown. As known in the art, micro-electro-mechanical systems, or MEMS, are integrated three-dimensional micro devices or systems combining electrical and mechanical components. They can be fabricated using integrated circuit (IC) processing techniques and can range in size from micrometers to millimeters. These systems can sense, control and actuate on the micro scale, and function individually or in arrays to generate effects on the macro scale. Examples of MEM switches incorporated into CMOS semiconductor processes are described more fully in U.S. Pat. No. 6,635,506 (Volant et al.), U.S. Pat. No. 6,621,392 (Volant et al.) and US Patent Application Publication No. 2003/0178635 (Volant et al.), all of which are incorporated herein by reference.

The MEM switch 30 illustrated in FIG. 3 comprises a double-pole MEM switch. The MEM switch 30 includes a first contact 32, second contact 34, first control electrode 36, second control electrode 38, movable contact 40, and freely movable electrode 42. As shown in FIG. 4, when a control voltage is applied between the freely movable electrode 42 and the second control electrode 38, the movable contact 40 closes against the first contact 32. Similarly, as shown in FIG. 5, when a control voltage is applied between the freely movable electrode 42 and the first control electrode 36, the movable contact 40 closes against the second contact 34. Additional information regarding the MEM switch 30 can be found in the above-referenced US Patent Application Publication No. 2003/01 78635 (Volant et al.). Although a double-pole MEM switch has been described, it will be apparent to one skilled in the art that any suitable type of MEM switch can be used in the practice of the present invention.

Referring again to FIG. 2, and also to FIG. 6, the operation of latch circuit 20 and of the MEM switches S1 and S2 in the embodiment 100 of the present invention will now be described. As shown in FIG. 2, during normal operation of the latch circuit 20 (i.e., scan mode), MEM switch S1 is open and MEM switch S2 is closed, thus enabling the latch circuit 20 to operate normally. When MEM switch S1 is open, the bypass connection 102 between the Data In and Data Out lines of the latch circuit 20 is disconnected. As shown in FIG. 6, when the latch circuit 20 is in a non-operational mode (e.g., during the functional (non-testing) operation of an integrated circuit), MEM switch S1 is closed and MEM switch S2 is open.

The closure of MEM switch S1 allows the Data In signal to bypass the latch circuit 20 via the bypass connection 102, thus improving performance by bypassing the delay associated with the latch circuit 20. This is especially important for designs that incorporate additional logic for test purposes only (e.g., scan latches). During normal operation, the test circuitry (e.g., latch circuit 20) is not used, but adds to signal propagation delay. By routing data signals around the test circuitry when not in use, this added propagation delay is eliminated. The purpose of MEM switch S2 is to prevent any data in latch B of the latch circuit 20 from appearing on the Data Out line during the non-operational mode of the latch circuit 20 (MEM switch S2 open), and to allow the latched data to appear on the Data Out line during the scan mode of the latch circuit 20 (MEM switch S2 closed).

Figure 7:
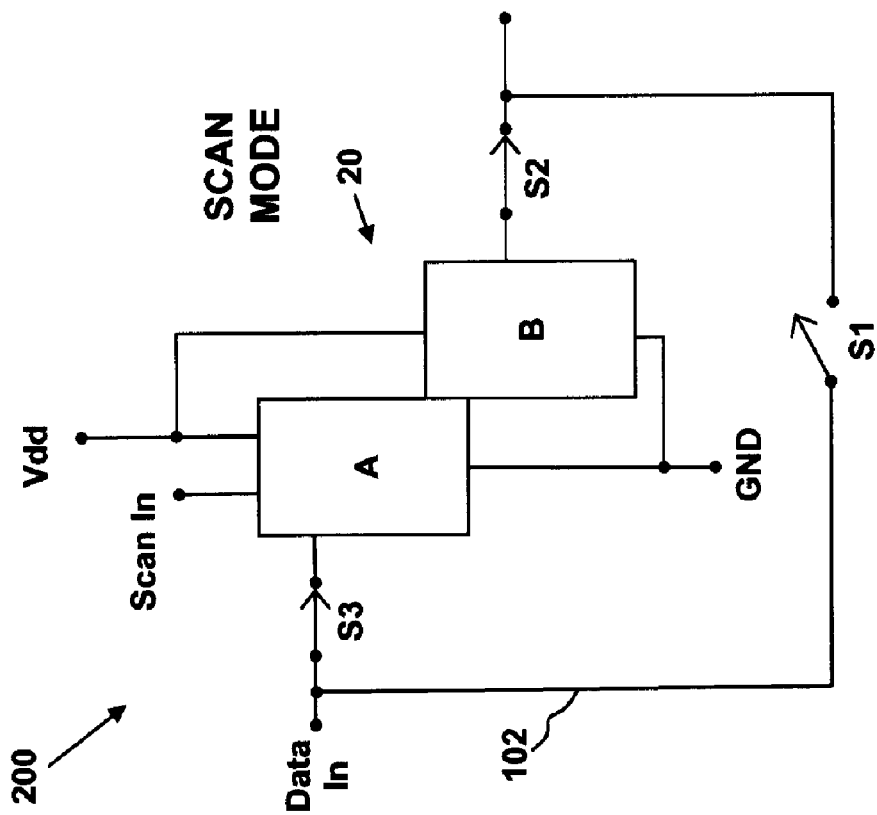
FIG. 7 depicts another embodiment of the present invention, wherein a plurality of MEM switches are incorporated into a latch circuit, and wherein the latch circuit is in a scan mode.

Another embodiment 200 of the present invention is illustrated in FIGS. 7 and 8. In this embodiment, an additional MEM switch S3 is added to the circuit described above with regard to embodiment 100. In particular, a MEM switch S3 is added to the Data In line entering latch A of the latch circuit 20. The purpose of MEM switch S3 is to separate the latch circuit 20 from the preceding logic circuitry connected to the Data In line of the latch circuit 20 (MEM switch S3 open). This reduces loading caused by the latch circuit 20 and eliminates possible current paths into and out of the latch circuit 20.

During normal operation of the latch circuit 20 (i.e., scan mode) shown in FIG. 7, MEM switch S1 is open and MEM switches S2 and S3 are closed to allow latch circuit 20 operation. In the non-operational mode of the latch circuit 20, however, as shown in FIG. 8, MEM switch S1 is closed and MEM switches S2 and S3 are open. As in embodiment 100 (FIGS. 2, 6), the closure of MEM switch S1 allows the Data In signal to bypass the latch circuit 20 via the bypass connection 102. Further, again as in embodiment 100, MEM switch S2 prevents any data in latch B of the latch circuit 20 from appearing on the Data Out line during the non-operational mode of the latch circuit 20 (MEM switch S2 open), and allows the latched data to appear on the Data Out line during the scan mode of the latch circuit 20 (MEM switch S2 closed).

Figure 10:
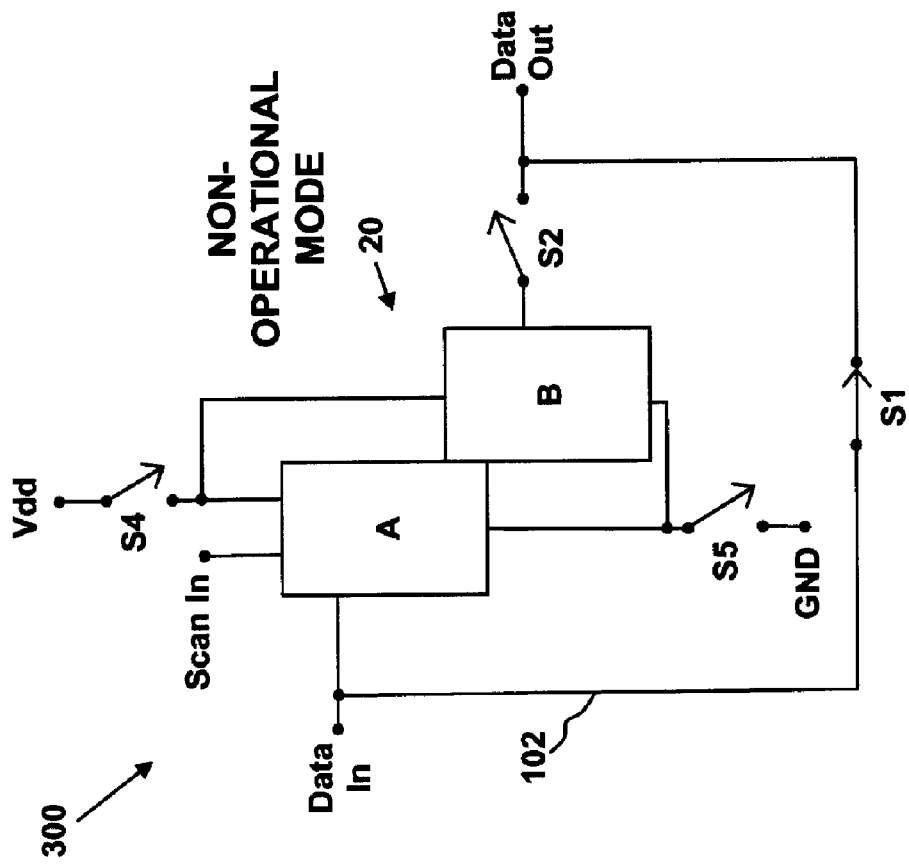
FIG. 10 depicts the embodiment of the present invention illustrated in FIG. 9, wherein the latch circuit is in a non-operational mode.
Figure 9:
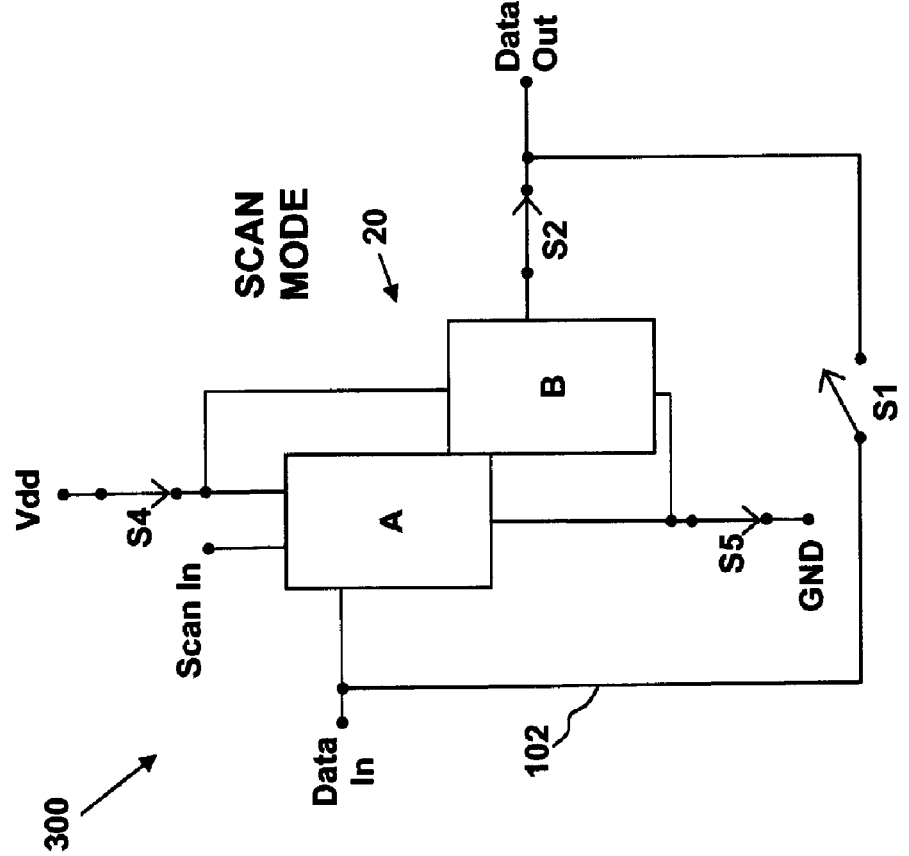
FIG. 9 depicts a further embodiment of the present invention, wherein a plurality of MEM switches are incorporated into a latch circuit, and wherein the latch circuit is in a scan mode.

A further embodiment 300 of the present invention is illustrated in FIGS. 9 and 10. In this embodiment, a pair of additional MEM switch S4 and S5 are added to the circuit described above with regard to embodiment 100. In particular, a MEM switch S4 is added to the power line (Vdd) of the latch circuit 20, while a MEM switch S5 is added to the ground line (GND) of the latch circuit 20. MEM switches S4 and S5 allow the power and ground to be disconnected from the latch circuit 20, thereby totally disabling the latch circuit 20 when this circuit is non-operational. This reduces the power consumption of the latch circuit 20.

In the scan mode of operation of the latch circuit 20, as shown in FIG. 9, MEM switch S1 is open to enable data latching by the latch circuit 20, MEM switch S2 is closed to allow data to exit the latch circuit 20 via the Data Out line, and MEM switches S4 and S5 are closed to provide operational power to the latch circuit 20. In the non-operational mode of the latch circuit 20, MEM switch S1 is closed, providing a bypass path around the latch circuit 20 to allow data from the preceding logic to flow around the latch circuit 20 to the following logic, while MEM switch S2 is open to prevent latch circuit 20 data from appearing on the Data Out line. In addition, MEM switches S4 and S5 are open, thereby completely disconnecting the latch circuit 20 from the power grid. Power consumption is therefore reduced because the latch circuit 20 is no longer connected to power. It should be noted that MEM switch S3 (FIGS. 7 and 8) can also be incorporated into embodiment 300 of the present invention.

For a chain of latches, the latches can have their power and ground pins bussed such that only a single MEM switch S4 and a MEM switch S5 are required to disconnect power from the chain of latches. This reduces the required number of MEM switches. Of course, some or all of the latches in the chain can be connected to power on an as needed basis.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A power reduction circuit, comprising:
   a logic block;
   a bypass line; and
   at least one micro-electromechanical (MEM) switch for selectively disabling the logic block by connecting the bypass line between an input and output of the logic block.

2. The power reduction circuit of claim 1, wherein the logic block is selected from the group consisting of a latch, memory array, embedded memory array, control logic, register, application specific integrated circuit (ASIC) core, microprocessor, and multithreaded processor.

3. The power reduction circuit of claim 1, wherein the logic block comprises a level-sensitive scan design (LSSD) latch.

4. The power reduction system of claim 1, further comprising:
   a MEM switch for disconnecting an input of the logic block.

5. A power reduction circuit comprising:
   a logic block; and
   at least one micro-electromechanical (MEM) switch for selectively disabling the logic block, the at least one MEM including:
   a MEM switch for disconnecting the logic block from power; and
   a MEM switch for disconnecting the logic block from ground.

6. A power reduction system, comprising:
   a logic block; and
   at least one micro-electromechanical (MEM) switch for selectively disabling the logic block, the at least one MEM including a MEM switch for disconnecting an output of the logic block.

7. A method for power reduction, comprising:
   providing a logic block and a bypass line; and
   selectively disabling the logic block using at least one micro-electromechanical (MEM) switch to connect the bypass line between an input and output of the logic block.

8. The method of claim 7, wherein the logic block is selected from the group consisting of a latch, memory array, embedded memory array, control logic, register, application specific integrated circuit (ASIC) core, microprocessor, and multithreaded processor.

9. The method of claim 7, wherein the logic block comprises a level-sensitive scan design (LSSD) latch.

10. The method of claim 7, further comprising:
    disconnecting an input of the logic block using a MEM switch.

11. A method for power reduction, comprising:
    providing a logic block; and
    selectively disabling the logic block by:
    selectively disconnecting the logic block from power using a micro-electromechanical (MEM) switch; and
    disconnecting the logic block from ground using a MEM switch.

12. A method for power reduction, comprising:
    providing a logic block; and
    selectively disabling the logic block by disconnecting an output of the logic block using a micro-electromechanical (MEM) switch.

13. A circuit, comprising:
    a logic block;
    a micro-electromechanical (MEM) switch for selectively disconnecting the logic block from power;
    a MEM switch for selectively disconnecting the logic block from ground;
    a bypass line connected between an input and output of the logic block for passing data around the logic block; and
    a MEM switch for selectively disconnecting the bypass line.

14. The circuit of claim 13, wherein the logic block is selected from the group consisting of a latch, memory array, embedded memory array, control logic, register, application specific integrated circuit (ASIC) core, microprocessor, and multithreaded processor.

15. The circuit of claim 13, further comprising:
    a MEM switch for selectively disconnecting an output of the logic block to prevent data from appearing on the output of the logic block.

16. The circuit of claim 13, further comprising:
    a MEM switch for selectively disconnecting the input of the logic block to separate the input of the logic block from preceding circuitry.

17. The circuit of claim 13, wherein, in an operational mode of the logic block, the MEM switch for selectively disconnecting the logic block from power and the MEM switch for selectively disconnecting the logic block from ground are closed to provide the logic block with power, and the MEM switch for selectively disconnecting the bypass line is open to prevent data from passing around the logic block.

18. The circuit of claim 13, wherein, in a non-operational mode of the logic block, the MEM switch for selectively disconnecting the logic block from power and the MEM switch for selectively disconnecting the logic block from ground are open, thereby disconnecting the logic block from power, and the MEM switch for selectively disconnecting the bypass line is closed, thereby allowing data to pass around the logic block.

* * * * *